United States Patent  
McKeever

(10) Patent No.: US 7,685,713 B2
(45) Date of Patent: Mar. 30, 2010

(54) PROCESS TO MINIMIZE TURBINE AIRFOIL DOWNSTREAM SHOCK INDUCED FLOWFIELD DISTURBANCE

(75) Inventor: Craig W. McKeever, Gilbert, AZ (US)

(73) Assignee: Honeywell International Inc., Morristown, NJ (US)

( * ) Notice: Subject to any disclaimer, the term of this patent is extended or adjusted under 35 U.S.C. 154(b) by 1268 days.

(21) Appl. No.: 11/204,261

(22) Filed: Aug. 9, 2005

(65) Prior Publication Data

US 2007/0033802 A1 Feb. 15, 2007

(51) Int. Cl.
B21D 53/78 (2006.01)
B21K 25/00 (2006.01)
B63H 1/26 (2006.01)
F01D 1/02 (2006.01)
F03B 1/00 (2006.01)

(52) U.S. Cl. .................. 29/889.7; 29/889; 29/889.2; 415/191; 415/208.2; 416/243

(58) Field of Classification Search ............... 29/889.7, 29/889; 415/191, 208.2; 416/243
See application file for complete search history.

(56) References Cited

U.S. PATENT DOCUMENTS 3,952,971 A * 4/1976 Whitcomb ............... 244/35 R
3,989,406 A * 11/1976 Bliss .......................... 415/1
3,993,414 A 11/1976 Meauze et al.
4,080,102 A 3/1978 Schwab
4,123,196 A 10/1978 Prince, Jr. et al.
4,408,957 A 10/1983 Kurzrock et al.
5,292,230 A 3/1994 Brown
5,692,709 A * 12/1997 Mihora et al. ............ 244/204
6,358,012 B1 * 3/2002 Staubach ................ 416/228
6,527,510 B2 3/2003 Olhofer et al.
6,666,654 B2 12/2003 Olhofer et al.
6,682,301 B2 * 1/2004 Kuhne .................... 415/181
2002/0065636 A1 5/2002 Yamaguchi et al.
2003/0170125 A1 * 9/2003 Olhofer et al. ........... 416/228
2006/0275134 A1 * 12/2006 Hasenjager et al. ...... 416/237

* cited by examiner

Primary Examiner—David P Bryant
Assistant Examiner—Alexander P Taousakis
(74) Attorney, Agent, or Firm—Ingrassia Fisher & Lorenz, P.C.

(57) ABSTRACT

A process of designing a transonic airfoil that results in an exit deviation angle that is optimized to minimize downstream shock induced flowfield disturbances. Specifically, a design process of a transonic airfoil minimizes pitchwise variation in downstream static pressure that includes determining an airfoil exit deviation angle and downstream turning for reduced shock from a trailing edge of the transonic airfoil.

16 Claims, 13 Drawing Sheets

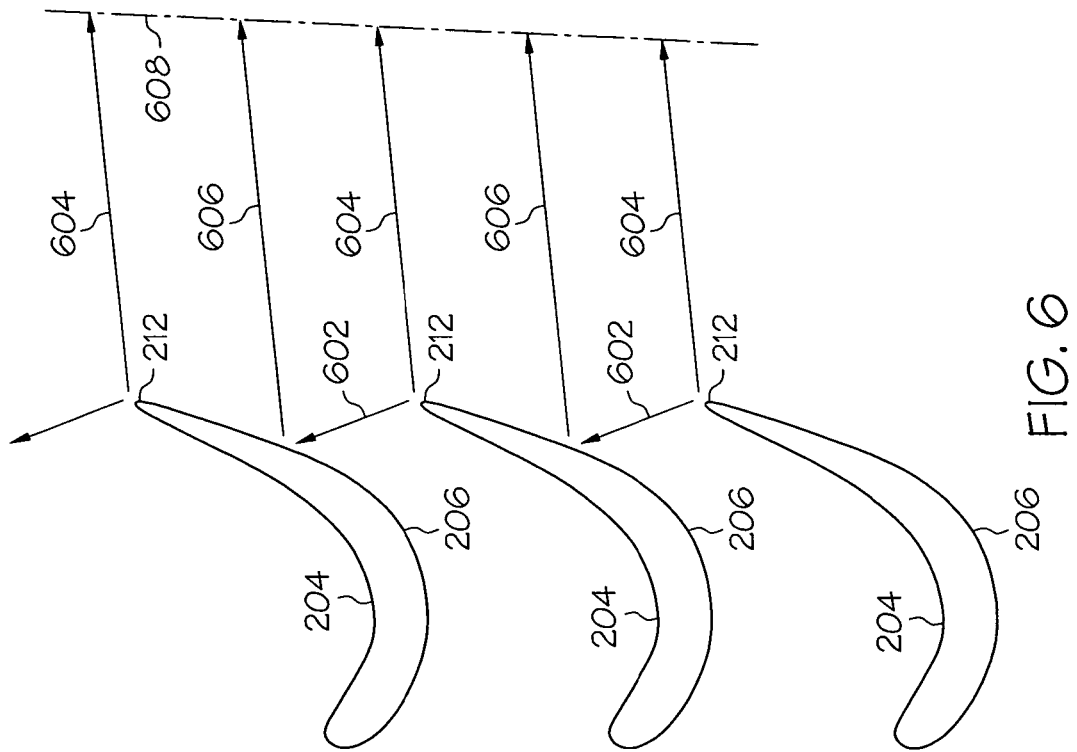
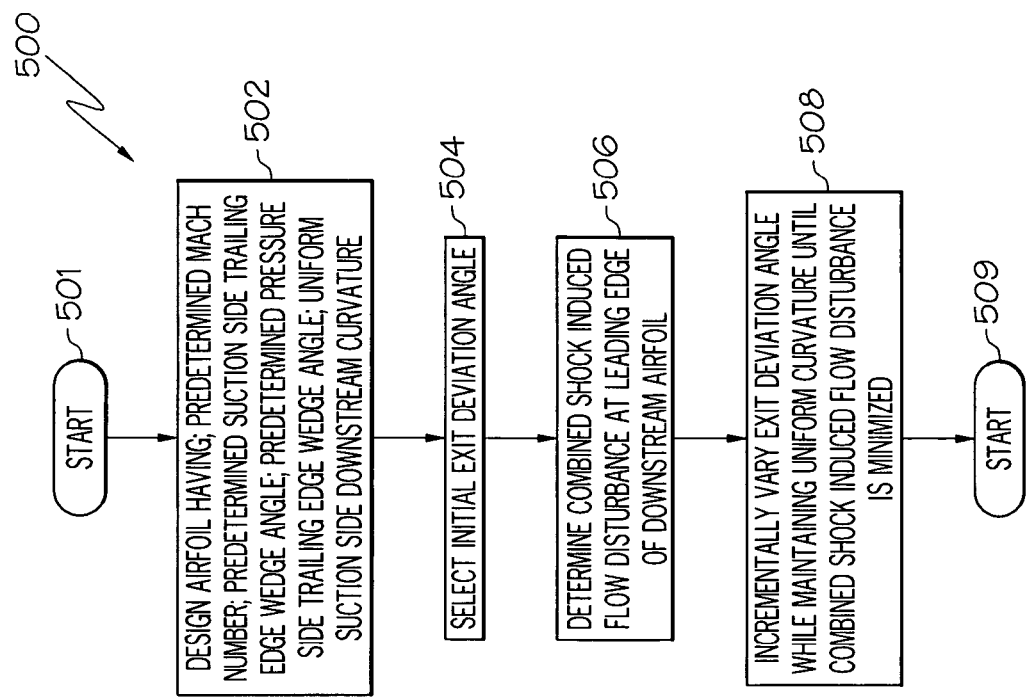

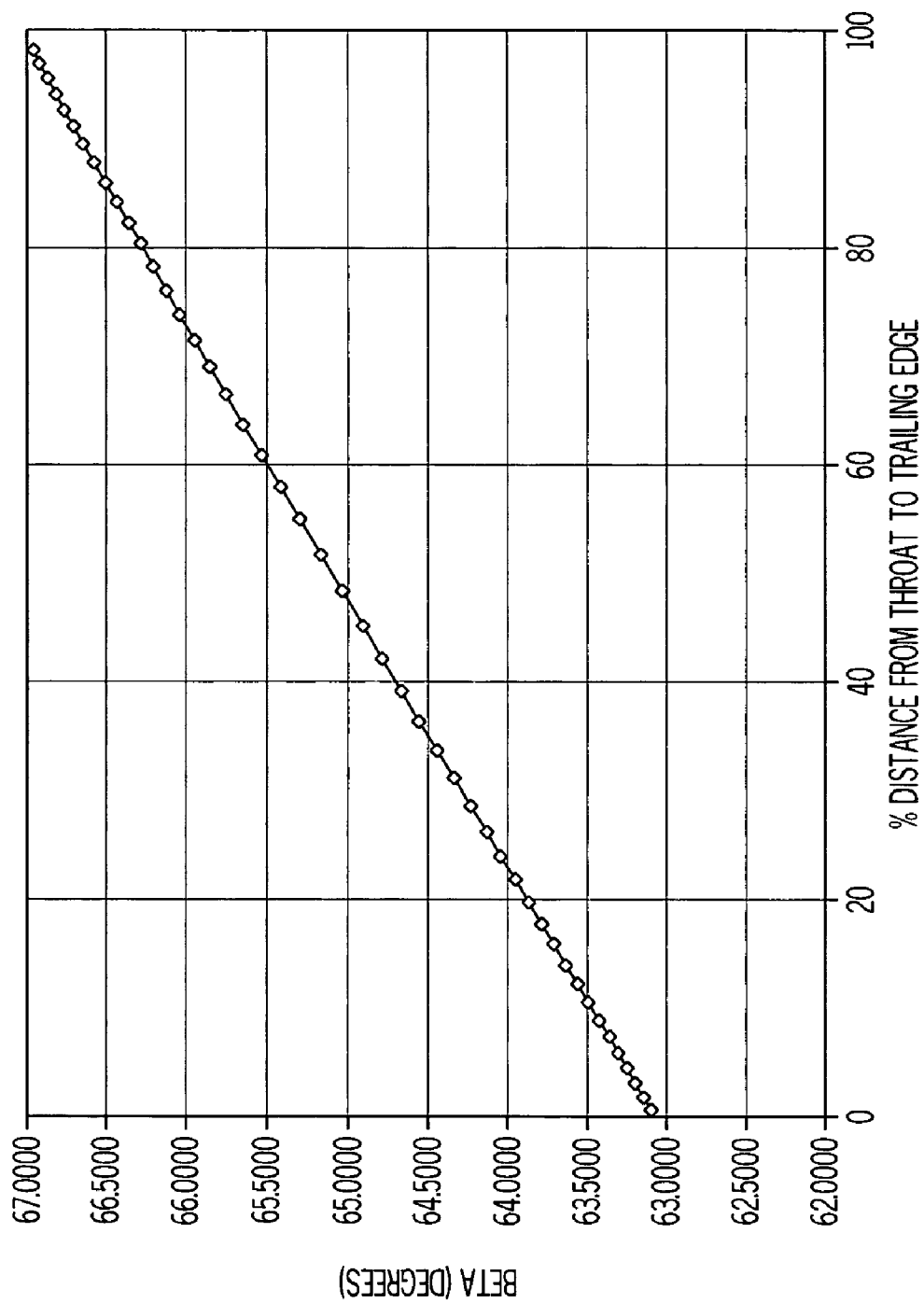

PROCESS TO MINIMIZE TURBINE AIRFOIL DOWNSTREAM SHOCK INDUCED FLOWFIELD DISTURBANCE

TECHNICAL FIELD

The present invention relates to an airfoil design for use in a turbine and, more particularly, to an airfoil design that minimizes downstream shock induced flowfield disturbances.

BACKGROUND

Many aircraft include one or more gas turbine engines. The gas turbine engines may be used to provide propulsion, electrical power, and/or bleed air. In efforts to reduce the cost and weight of aircraft gas turbine engines, there recently has been a drive toward high-work turbine stages. The airfoils in high-work turbine stages typically operate in transonic conditions. That is, the airfoils typically operate in conditions where the Mach number in the relative frame of the airfoil exceeds 1.0 over some portion of the airfoil surface.

When turbine airfoils operate in transonic conditions, shock waves may be generated at the trailing edge of the airfoils. The generated shock waves may propagate downstream and cause unsteady pressure variations on downstream airfoils and/or flow angle variations at the inlet to downstream airfoils. These unsteady pressure variations and flow angle variations can adversely impact both the performance and the mechanical integrity of the affected airfoils.

Hence, there is a need for a design process for transonic airfoils that minimizes unsteady pressure variations on downstream airfoils and/or flow angle variations at the inlet to downstream airfoils that result from trailing edge shocks. The present invention addresses at least this need.

BRIEF SUMMARY

The present invention includes a process of designing transonic airfoils to minimize downstream shock and, more particularly, to reduce the unsteady variation in static pressure and flow angle at downstream airfoils.

In one embodiment, and by way of example only, a method of designing adjacent transonic airfoils to minimize downstream shock induced flowfield disturbance, in which each transonic airfoil has an adjacent airfoil and a predetermined airfoil exit mach number, exit flow angle, pressure side trailing edge wedge angle, suction side trailing edge wedge angle, and suction side throat angle, includes the steps of selecting an airfoil exit deviation angle for one of the transonic airfoils. A combined shock induced flowfield disturbance at a position that corresponds to a leading edge of a downstream airfoil is determined. The airfoil exit deviation angle is varied until the combined shock induced flowfield disturbance at the position that corresponds to a leading edge of a downstream airfoil is minimized.

In another exemplary embodiment, a method of designing adjacent transonic airfoils to minimize downstream shock induced flowfield disturbance, in which each transonic airfoil includes at least two adjacent airfoils, a suction surface and a pressure surface coupled together via a leading edge and a trailing edge, and each airfoil is spaced apart from its adjacent airfoils to define an airfoil passage therebetween includes the steps of determining a cross passage shock location on each airfoil suction surface. The cross passage shock location corresponds to a location off of which a shock that emanates from an adjacent airfoil trailing edge pressure surface reflects. Each airfoil suction surface is provided with a concentrated convex curvature at the cross passage shock location.

Other independent features and advantages will become apparent from the following detailed description, taken in conjunction with the accompanying drawings which illustrate, by way of example, the principles of the invention.

BRIEF DESCRIPTION OF THE DRAWINGS

The following drawings are illustrative of the particular embodiments of the invention and therefore do not limit its scope. They are presented to assist in providing a proper understanding of the invention. The drawings are not to scale and are intended for use in conjunction with the explanations in the following detailed descriptions. The present invention will hereinafter be described in conjunction with the appended drawings, wherein like reference numerals denote like elements, and wherein:

FIG. 5 is a flowchart depicting an exemplary embodiment of the design process of the present invention;

FIG. 6 illustrates cross section views of adjacent airfoils and more particularly illustrating the shocks that emanate therefrom;

FIG. 18 is a graph illustrating uniform curvature of an exemplary airfoil by graphically depicting suction side surface angle from the throat to the trailing edge.

DETAILED DESCRIPTION OF A PREFERRED EMBODIMENT

Before proceeding with the detailed description, it is to be appreciated that the described embodiment is not limited to use in conjunction with a particular type of turbine engine. Thus, although the present embodiment is, for convenience of explanation, depicted and described as being implemented in a multi-spool turbofan gas turbine jet engine, it will be appreciated that it can be implemented in various other types of turbines, and in various other systems and environments.

Figure 1:
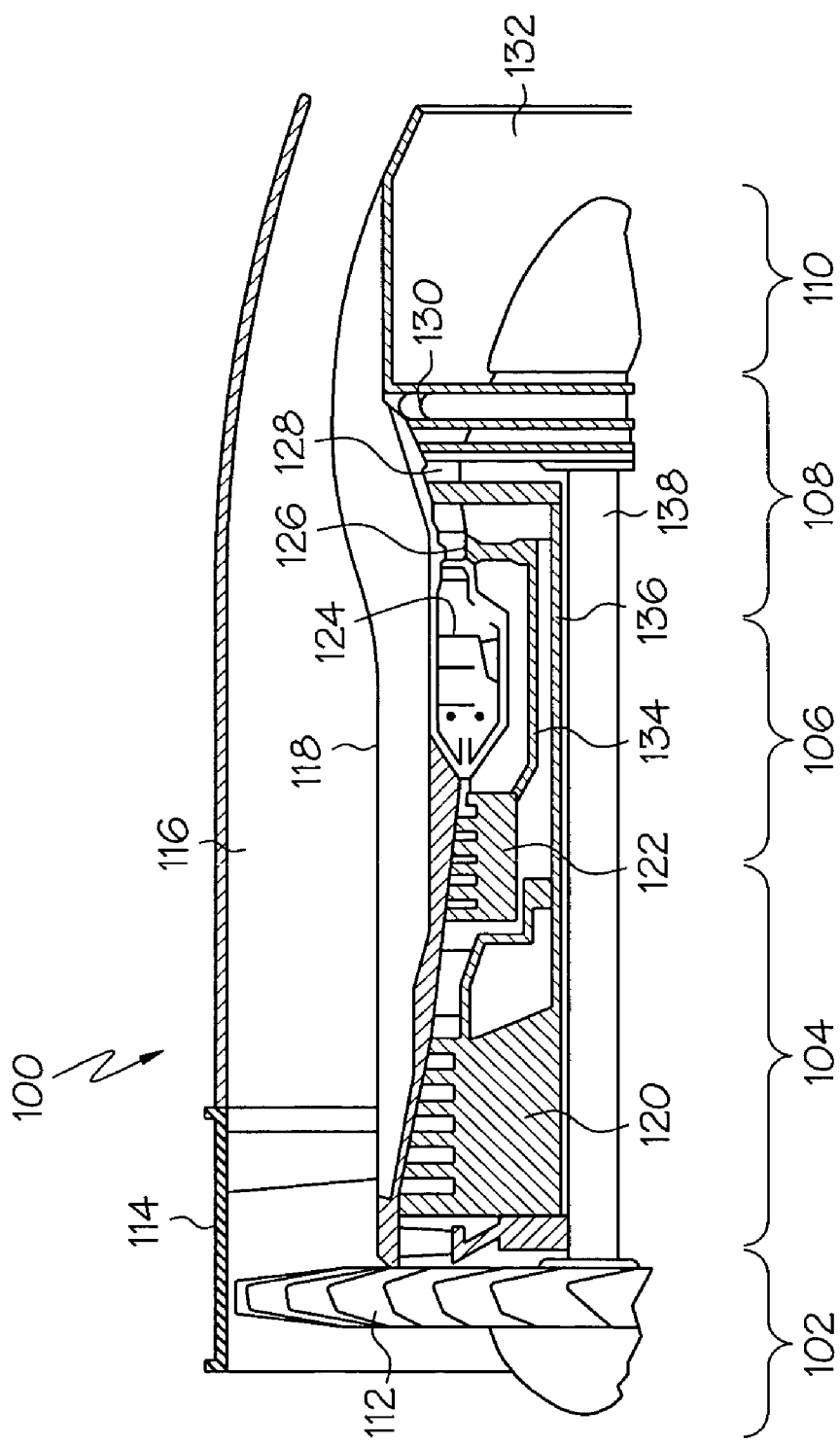
FIG. 1 is a cross section view of an exemplary gas turbine engine that may be implemented according to an embodiment of the present invention.

An exemplary embodiment of a multi-spool turbofan gas turbine jet engine 100 is depicted in FIG. 1, and includes an intake section 102, a compressor section 104, a combustion section 106, a turbine section 108, and an exhaust section 110. The intake section 102 includes a fan 112, which is mounted in a fan case 114. The fan 112 draws air into the intake section 102 and accelerates it. A fraction of the accelerated air exhausted from the fan 112 is directed through a bypass section 116 disposed between the fan case 114 and an engine cowl 118, and provides a forward thrust. The remaining fraction of air exhausted from the fan 112 is directed into the compressor section 104.

The compressor section 104 includes two compressors, an intermediate pressure compressor 120, and a high pressure compressor 122. The intermediate pressure compressor 120 raises the pressure of the air directed into it from the fan 112, and directs the compressed air into the high pressure compressor 122. The high pressure compressor 122 compresses the air still further, and directs a majority of the high pressure air into the combustion section 106. A fraction of the compressed air bypasses the combustion section 106 and is used to cool, among other components, turbine blades in the turbine section 108. In the combustion section 106, which includes an annular combustor 124, the high pressure air is mixed with fuel and combusted. The high-temperature combusted air is then directed into the turbine section 108.

The turbine section 108 includes three turbines disposed in axial flow series, a high pressure turbine 126, an intermediate pressure turbine 128, and a low pressure turbine 130. The high-temperature combusted air from the combustion section 106 expands through each turbine 126-130, causing it to rotate. The air is then exhausted through a propulsion nozzle 132 disposed in the exhaust section 110, providing addition forward thrust. As the turbines rotate, each drives equipment in the engine 100 via concentrically disposed shafts or spools. Specifically, the high pressure turbine 126 drives the high pressure compressor 122 via a high pressure spool 134, the intermediate pressure turbine 128 drives the intermediate pressure compressor 120 via an intermediate pressure spool 136, and the low pressure turbine 130 drives the fan 112 via a low pressure spool 138.

Figure 2:
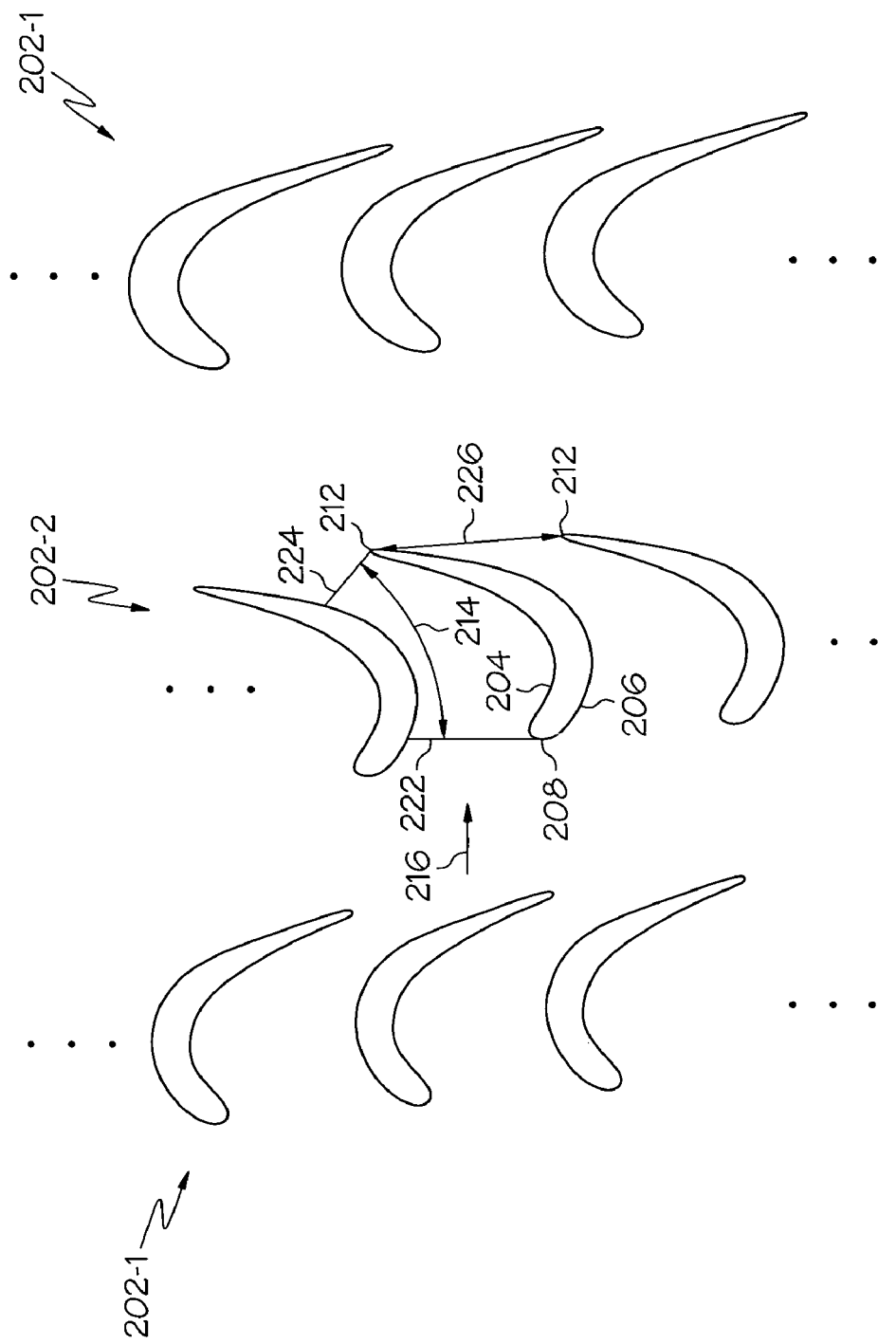
FIG. 2 is a schematic representation of a portion of a turbine that may be used in the engine of FIG. 1 and showing a simplified representation of a plurality of adjacent airfoils.

As is shown more clearly in FIG. 2, each of the turbines 126-130 in the turbine section 108 includes alternating rows of adjacent airfoils 202, and more specifically, alternating rows of adjacent static airfoils 202-1 and adjacent rotary airfoils 202-2. The static airfoils 202-1 are used to direct the combusted air from the combustion section 106 onto the rotary airfoils 202-2. The rotary airfoils 202-2 in turn cause the associated turbines 126-130 to rotate. It will be appreciated that, for clarity and ease of depiction, only two partial rows of adjacent static airfoils 202-1 and only one partial row of adjacent rotary airfoils 202-2 are shown. It will additionally be appreciated that the turbines 126-130 are typically implemented with more than the depicted number of rows.

With continued reference to FIG. 2, it is seen that each airfoil 202 includes a pressure surface 204 and a suction surface 206. The pressure surface 204 and suction surface 206 are coupled together via a leading edge 208 and a trailing edge 212. The space between, and bounded by, adjacent airfoils 202 defines an airfoil passage 214. The incoming gas stream (e.g., combusted gas) 216 enters the airfoil passage 214 via an inlet 222. The gas stream then exits the airfoil passage 214 via a region that is generally referred to as the airfoil throat 224. Moreover, the spacing between the trailing edges 212 of adjacent airfoils is known as the blade pitch 226.

Figure 3:
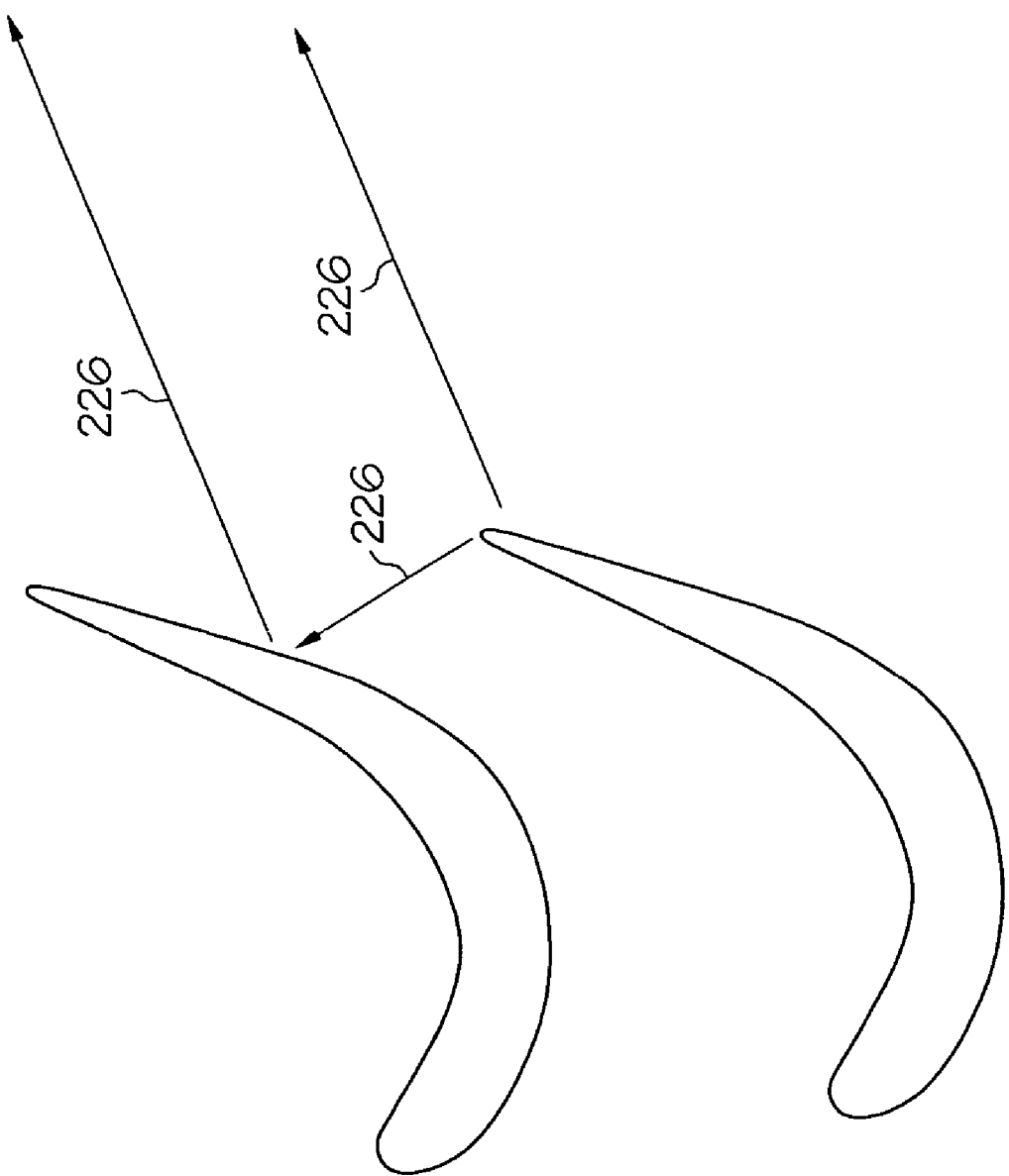
FIG. 3 is a cross section view of two transonic airfoils illustrating shocks that emanate therefrom.

As was previously noted, high-work turbine stages typically operate with the turbine airfoils 202 in transonic conditions. As a result, and as is shown more clearly in FIG. 3, shock waves 226 can be generated at the airfoil trailing edges 212, which can cause unsteady pressure variations on downstream airfoils 202 that can adversely impact airfoil 202 performance and mechanical integrity. However, the airfoils 202 depicted and described herein are designed and implemented according to a process that results in minimal shock induced flowfield disturbance to downstream airfoils 202. More specifically, the process reduces the unsteady variation in static pressure and/or the change in flow angle at the leading edge 208 of a downstream airfoil 202. This process will be described in detail further below. First, various parameters that are used to define the geometry of an airfoil 202, and which are used to implement the design process, will be described. In doing so, reference should be now be made to FIG. 4, which depicts a single airfoil 202 and each of the parameters.

It will be appreciated that the geometry of an airfoil 202 may be defined in accordance with any one of numerous parameters. However, the parameters that are used herein include an airfoil trailing edge metal angle 402, a suction side wedge angle 404, a pressure side wedge angle 406, a suction side throat angle 408, airfoil exit flow angle 410, deviation angle 412, an airfoil suction side curvature 414, and downstream turning (not explicitly illustrated). Each of these parameters will now be further defined.

The airfoil trailing edge metal angle 402 is the angle between a trailing edge metal line 401 and a line 403 that extends parallel to the engine rotational axis 405. The trailing edge metal line 401 is a line that bisects the pressure surface 204 and the suction surface 206 at the trailing edge 212. The suction side wedge angle 404 is the angle formed between the suction surface 206 at the trailing edge 212 and the trailing edge metal line 401. Similarly, the pressure side wedge angle 406 is the angle formed between pressure surface 204 at the trailing edge 212 and the trailing edge metal line 401.

Figure 4:
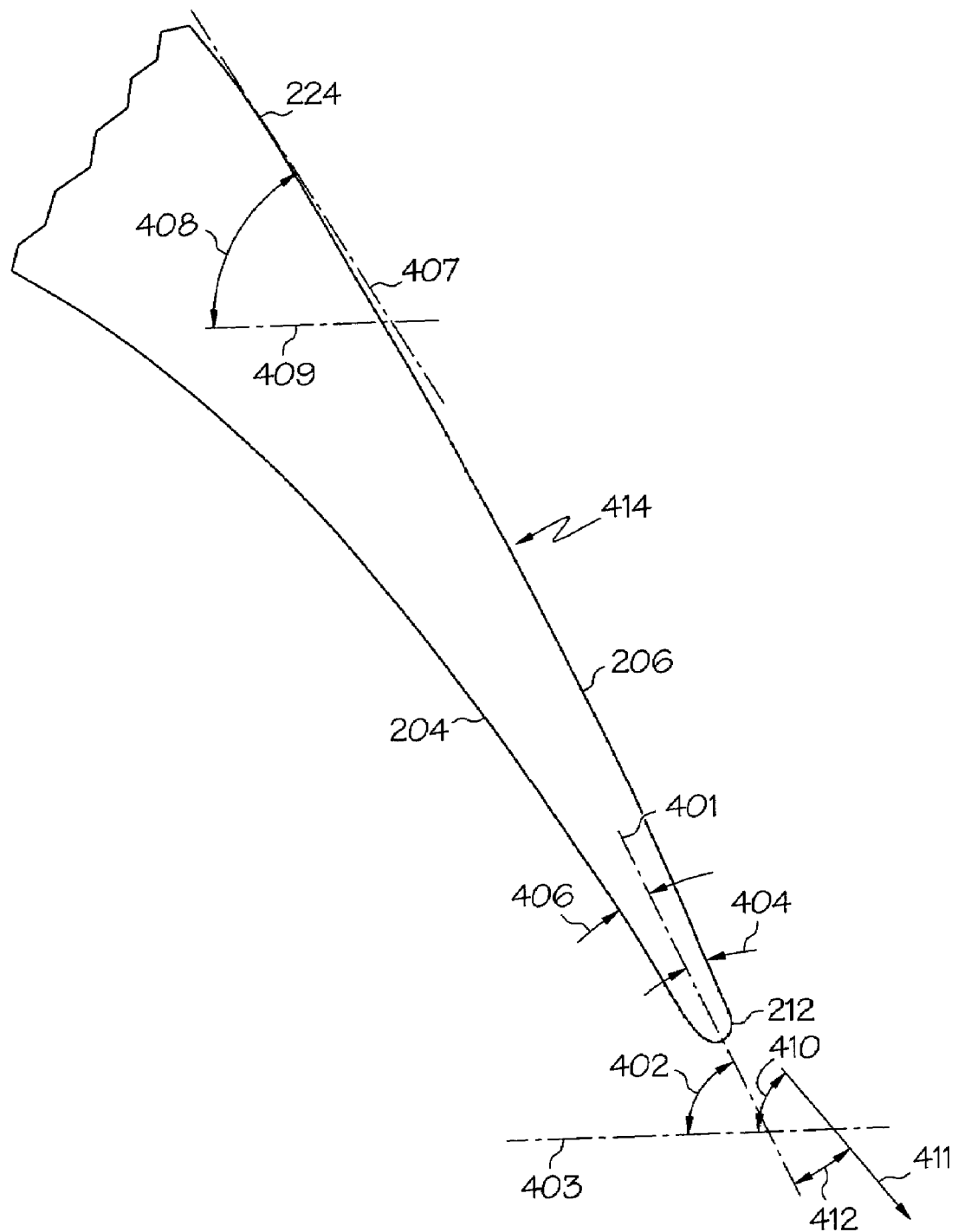
FIG. 4 is a cross section view of a portion of a single transonic airfoil illustrating various geometric parameters used to describe an airfoil and that are used to implement the design process of an embodiment of the present invention.

The suction side throat angle 408 is the angle formed between a tangent 407 of the suction surface 206 at the airfoil throat 224 and another line 409 that extends parallel to the engine rotational axis 405. The airfoil exit flow angle 410 is the angle formed between flow streamlines 411 downstream of the airfoil trailing edge 212 and the line 403 that extends parallel to the engine rotational axis 405. It will be appreciated that the relationship of the trailing edge metal line 401 and the flow streamlines 411 illustrated in FIG. 4 represent a positive exit deviation angle 412 according to the convention defined herein.

The exit deviation angle 412 is defined as the angle between the trailing edge metal angle 402 and the airfoil exit flow angle 410. The suction side downstream curvature 414 is a curve that describes the airfoil suction side 206 downstream of the airfoil throat 224. Finally, downstream turning is equal to the airfoil trailing edge metal angle 402 plus the suction side wedge angle 404 minus the suction side throat angle 408. It will be appreciated that the downstream turning is sometimes referred to as the unguided turning.

Having defined the various parameters that are used to define the airfoil geometry that is used to implement the above-mentioned design process, the design process will now be described in detail. In doing so, reference should be made to FIG. 5, which depicts the design process in flowchart form, in combination with FIG. 4. The process 500 begins by designing a transonic airfoil 202 that will have a predetermined airfoil exit mach number, a predetermined suction side trailing edge wedge angle 404, a predetermined pressure side trailing edge wedge angle 406, a predetermined exit flow angle, and a uniform suction side downstream curvature 414 (502). The values selected for these parameters are based, at least in part, on the desired performance from the airfoil 202.

Figure 19:
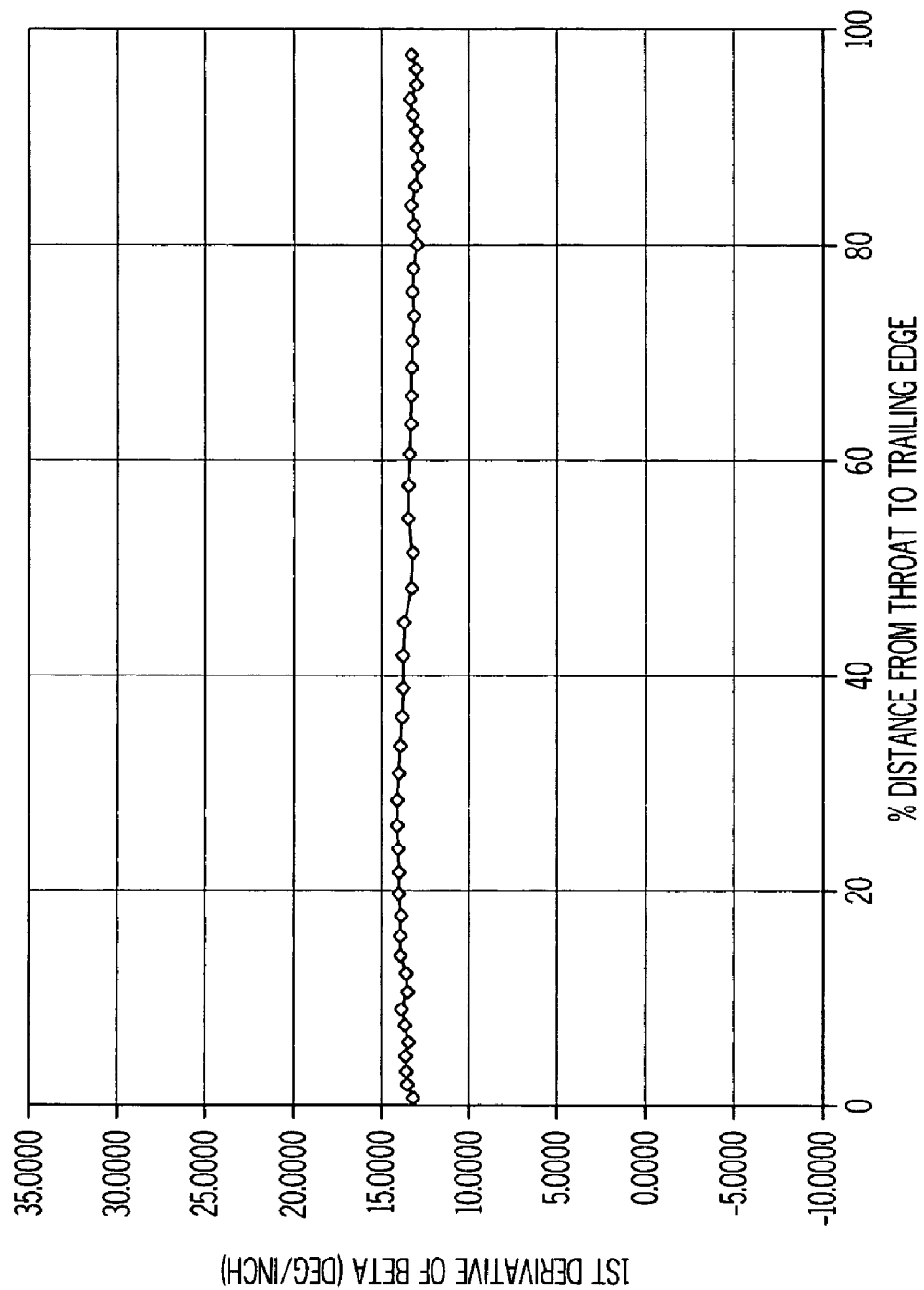
FIG. 19 is a graph illustrating uniform curvature of an exemplary airfoil by graphically depicting the first derivative of suction side surface angle from the throat to the trailing edge.

Before proceeding further, it is noted that, for added clarity, FIGS. 18 and 19 are included herewith to graphically illustrate a uniform suction downstream curvature 414. In particular, as is shown in FIG. 18, with a uniform curvature 414 the metal angle increases linearly with distance from the throat 224 to the trailing edge 212. Moreover, as FIG. 19 illustrates, the first derivative of the metal angle, between the throat 224 and the trailing edge 212, is constant.

After the transonic airfoil 202 is designed using the above-described geometric parameters, an initial value for the exit deviation angle 412 is selected for the transonic airfoil (504). Typically, this is done by varying, as needed, the value of the trailing edge metal angle 402, which in turn affects the downstream turning 414. The combined shock induced flowfield disturbance at a position that corresponds to the leading edge 208 of the corresponding downstream airfoil 202 is then determined (506). Thereafter, the exit deviation angle 412 is incrementally varied, while maintaining a uniform suction side downstream curvature 416, until the combined shock induced flowfield disturbance, at the corresponding downstream airfoil leading edge position, is minimized (508).

It will be appreciated that the specific methodology used to determine the combined shock induced flowfield disturbance (506) may vary. However, in accordance a particular preferred methodology, this determination is made based on the static pressure variations at the corresponding downstream airfoil leading edge position that are associated with the shocks that emanate from the airfoil trailing edge pressure side 204 and airfoil trailing edge suction side 206. With reference now to FIG. 6, this methodology will be described in more detail.

As FIG. 6 illustrates, and as was previously mentioned, during turbine operation, shocks emanate from the trailing edges 212 of the airfoils 202. In particular, a shock 602 emanates from each of the airfoil trailing edge pressure sides 204, and a shock 604 emanates from each of the airfoil trailing edge suction sides 206. As FIG. 6 also shows, the airfoil trailing edge pressure side shocks 602 cross the airfoil flow passage 214 and are each reflected off of the suction surface 206 of an adjacent airfoil 202 in its row, resulting in reflected shocks 606. Thus, airfoil trailing edge pressure side shocks 602 are also referred to as cross passage shocks. The airfoil trailing edge suction side shocks 604 and the reflected shocks 606 each cause static pressure variations at the corresponding downstream airfoil leading edge positions 608. Together, these static pressure variations cause in the combined shock induced flowfield disturbance.

It may thus be appreciated that the combined shock induced flowfield disturbance for an airfoil 204 is minimized when neither the airfoil trailing edge suction side shock 604 nor the reflected shock 606 dominate at the airfoil leading edge position 608. The condition under which neither of these shocks 604, 606 is dominant at the airfoil leading edge position 608 is determined by comparing the relative peak-to-peak amplitudes of the pitchwise variation in static pressure at the airfoil leading edge position 608 that result from the shocks 604, 606. If, based on this comparison, the airfoil trailing edge suction side shock 604 is dominant, then the exit deviation angle 412 is made more negative. Conversely, if the reflection shock 606 is dominant, then the exit deviation angle 412 is made more positive.

More specifically, the peak-to-peak amplitude (e.g., $P_{max}-P_{min}$) of the pitchwise static pressure variation associated with the trailing edge suction side shock ($AMPLITUDE_{suction}$) and the peak-to-peak amplitude of the pitchwise static pressure variation associated with the reflected shock ($AMPLITUDE_{reflect}$), are determined and compared. If the peak-to-peak amplitude of the pitchwise static pressure variation associated with the trailing edge suction side shock ($AMPLITUDE_{suction}$) exceeds the peak-to-peak amplitude of the pitchwise static pressure variation associated with the reflected shock ($AMPLITUDE_{reflect}$), then the suction side shock 604 is dominant. Conversely, if the peak-to-peak amplitude of the pitchwise static pressure variation associated with the reflected shock ($AMPLITUDE_{reflect}$) exceeds the peak-to-peak amplitude of the pitchwise static pressure variation associated with the trailing edge suction side shock ($AMPLITUDE_{suction}$), then the reflection shock 606 is dominant.

Once the determination is made as to which shock is dominant, the exit deviation angle 412 is varied until a ratio of the peak-to-peak amplitudes is less than a predetermined value. More specifically, if the comparison indicates that the suction side shock 604 is dominant, then the exit deviation angle 412 is made more negative until the ratio ($AMPLITUDE_{suction}$)/($AMPLITUDE_{reflect}$) is less than a predetermined value. Conversely, if the reflection shock 606 is dominant, then the exit deviation angle 412 is made more positive until ($AMPLITUDE_{reflect}$)/($AMPLITUDE_{suction}$) is less than the predetermined value. It will be appreciated that the predetermined value may vary, but in a particular preferred embodiment the predetermined value is 2.0.

With reference now to FIGS. 7-12, a specific example of the process 500 illustrated in FIG. 5 and described above will now be provided. In this specific example, the airfoil 202 is designed with the following geometric parameters: the suction side wedge angle 404 and the pressure side wedge angle 406 are each equal to 5 degrees; the suction side downstream curvature 416 is uniform; and the exit relative mach number is 1.06 (502). Moreover, the airfoil 202 design is implemented for the 50% span section, which is the section halfway between the hub and tip of the flowpath. It will be appreciated, however, that the design could be implemented for any other section of the airfoil 202 such as, for example, the 25% span or the 75% span.

Figure 8:
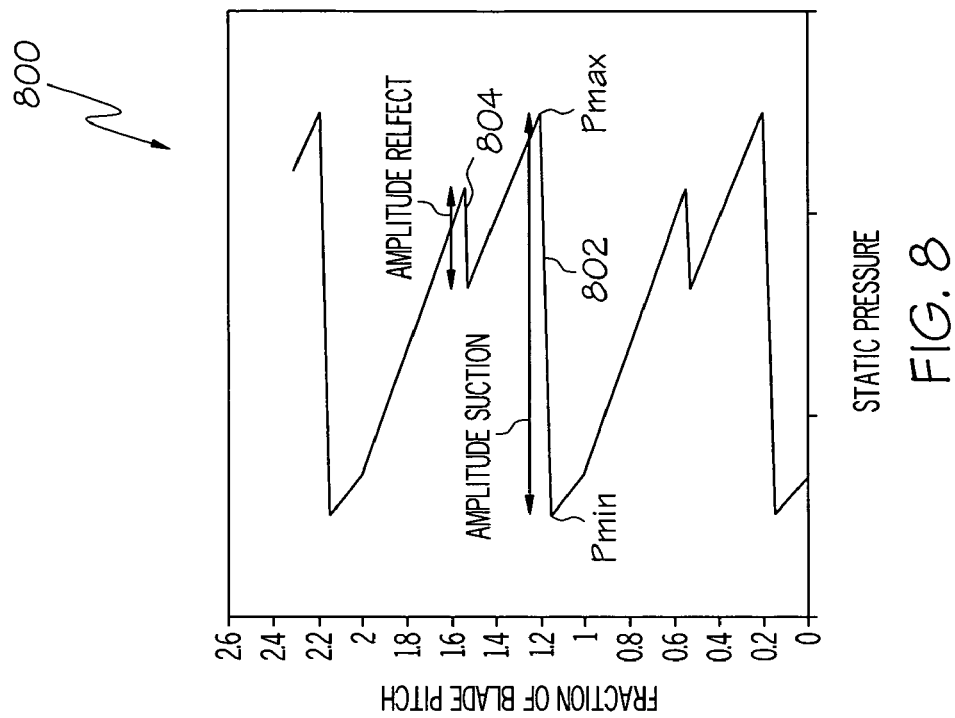
FIGS. 8 and 10 are each graphs illustrating the pitchwise static pressure variation at a downstream location resulting from the airfoils shown in FIGS. 7 and 9, respectively.
Figure 7:
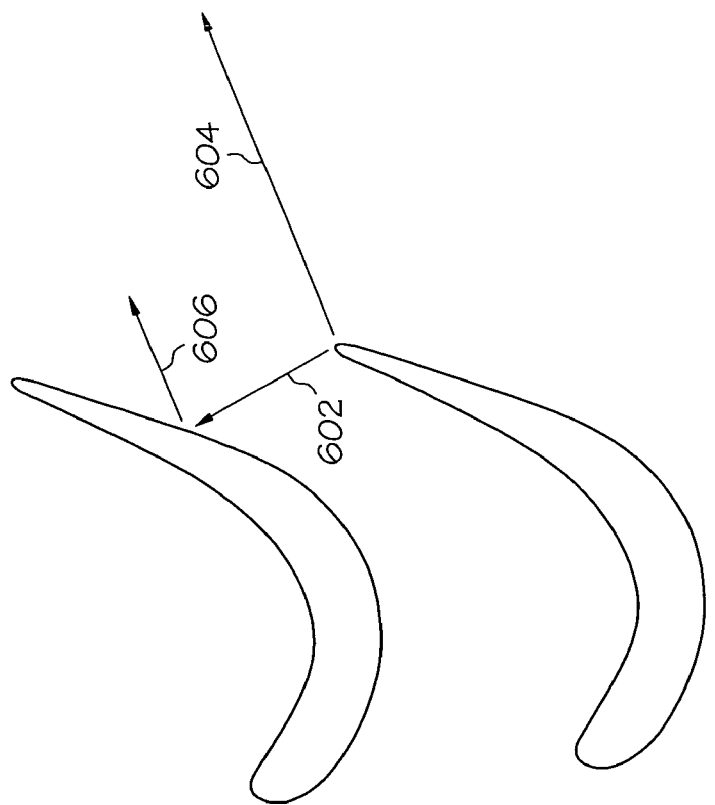
FIGS. 7, 9, and 11 are each cross section views of two adjacent airfoils designed using specified values of the geometric parameters shown in FIG. 4, and depicting relative magnitudes of the shocks emanating therefrom.

Initially, the deviation angle 412 is set to −1.0 degree (502), which means the trailing edge metal angle 402 is nearly equal to the exit flow angle 410. The analytical results for this initial airfoil design, which are preferably conducted using a computational tool such as Computation Fluid Dynamics (CFD), are shown in FIGS. 7 and 8. As FIG. 7 clearly shows, the trailing edge suction side shock 604 is substantially stronger than the reflected shock 606, and as FIG. 8 graphically illustrates, the peak-to-peak amplitude of the pitchwise static pressure variation associated with the trailing edge suction side shock ($AMPLITUDE_{suction}$) 802 exceeds the peak-topeak amplitude of the pitchwise static pressure variation associated with the reflected shock (AMPLITUDE$_{reflect}$) 804 (506). Moreover, the ratio (AMPLITUDE$_{suction}$)/(AMPLITUDE$_{reflect}$) exceeds 2.0. It is noted that in the graph 800 shown in FIG. 8, as well as the graphs 1000 and 1200 shown in FIGS. 10 and 12, respectively, the x-axis is static pressure, and the y-axis is (in the relative frame of reference of the transonic airfoil 202) the distance along line 608 as a fraction of blade pitch 226.

Because the combined shock induced flowfield disturbance at the airfoil leading edge position 608 is dominated by the trailing edge suction side shock 604, and the ratio (AMPLITUDE$_{suction}$)/(AMPLITUDE$_{reflect}$) exceeds 2.0, the exit deviation angle 412 is made more negative (508). To do so, the airfoil trailing edge metal angle 402 is reduced so that it is considerably less than the exit flow angle 410. As a result, the downstream turning 414 is decreased. In the particular embodiment, the trailing edge metal angle 402 is reduced so that the exit deviation angle made more negative by changing it from −1.0 degree to a value of −6.0 degrees. This results in the downstream turning 414 decreasing to a value of 2.0 degrees.

Figure 10:
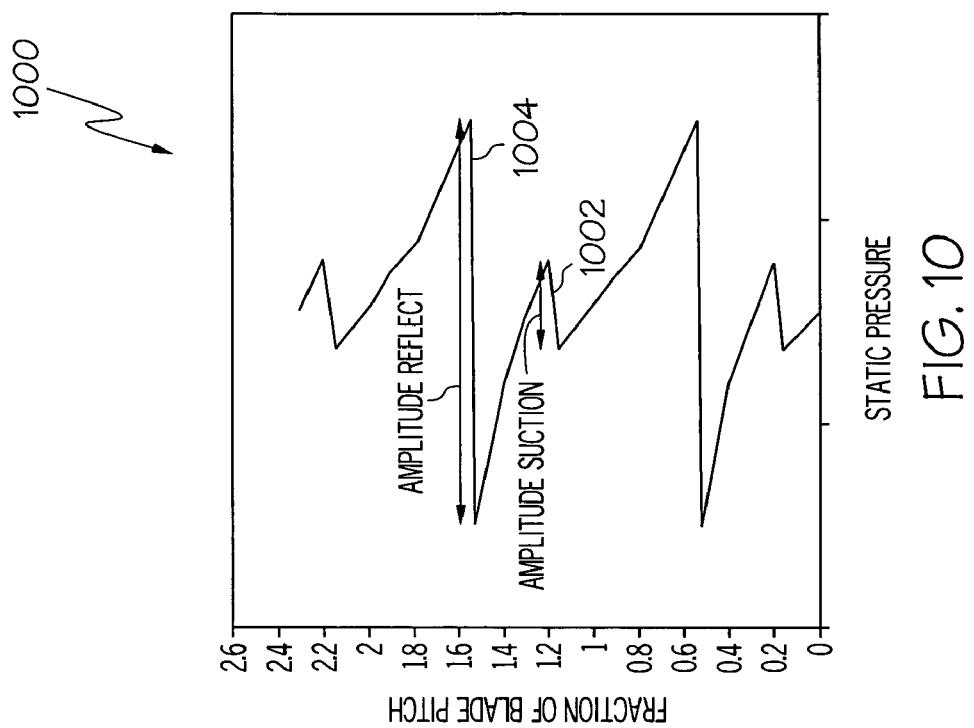
Figure 9:
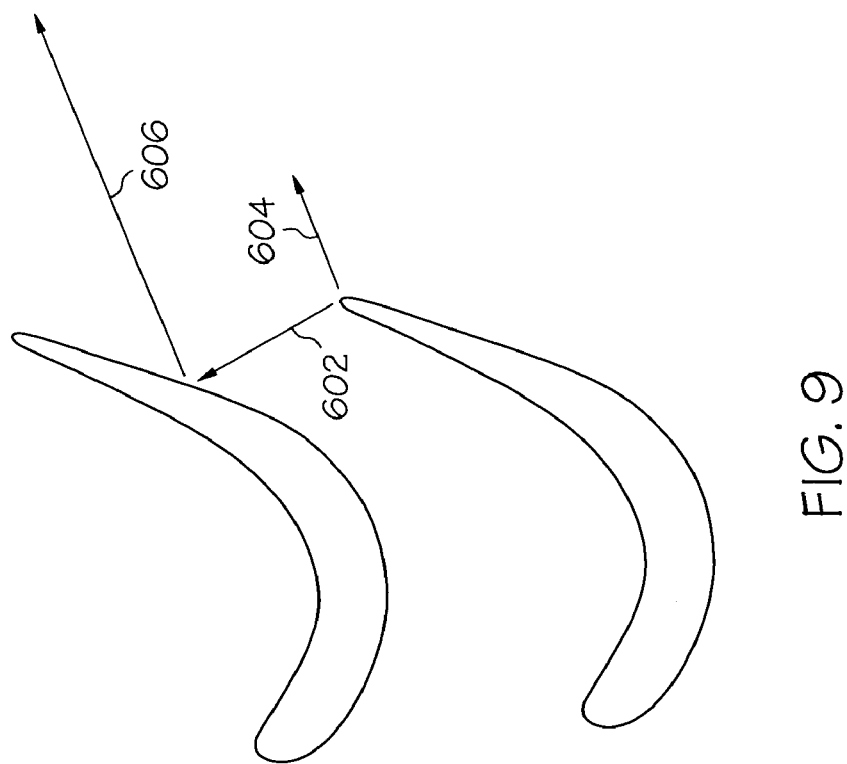

The analytical results for the above-described airfoil design are shown in FIGS. 9 and 10. In this instance, as is shown in FIG. 9, the more negative deviation angle 412 of −6.0 degrees results in a weaker suction side trailing edge shock 604 than the initial iteration. Conversely, this deviation angle 412 results in a stronger reflection shock 606. As a result, and as FIG. 10 further illustrates, the peak-to-peak amplitude of the pitchwise static pressure variation associated with the reflection shock (AMPLITUDE$_{reflect}$) 1004 exceeds the peak-to-peak amplitude of the pitchwise static pressure variation associated with the trailing edge suction side shock (AMPLITUDE$_{suction}$) 1002 (506). Moreover, the ratio (AMPLITUDE$_{reflect}$)/(AMPLITUDE$_{suction}$) also exceeds 2.0.

Because the combined shock induced flowfield disturbance at the airfoil leading edge position 608 is dominated by the reflection shock 606, and the ratio (AMPLITUDE$_{reflect}$)/(AMPLITUDE$_{suction}$) again exceeds 2.0, the exit deviation angle 412 is made more positive (508). To do so, the airfoil trailing edge metal angle 402 is increased slightly, which results in the downstream turning 414 being increased. In the particular embodiment, the trailing edge metal angle 402 is increased so that the exit deviation angle magnitude is changed to a value of −5.0 degrees, and the resulting downstream turning 414 increases to a value of 4.0 degrees. As in each of the previous iterations, a uniform suction side downstream curvature 414 is applied.

Figure 11:
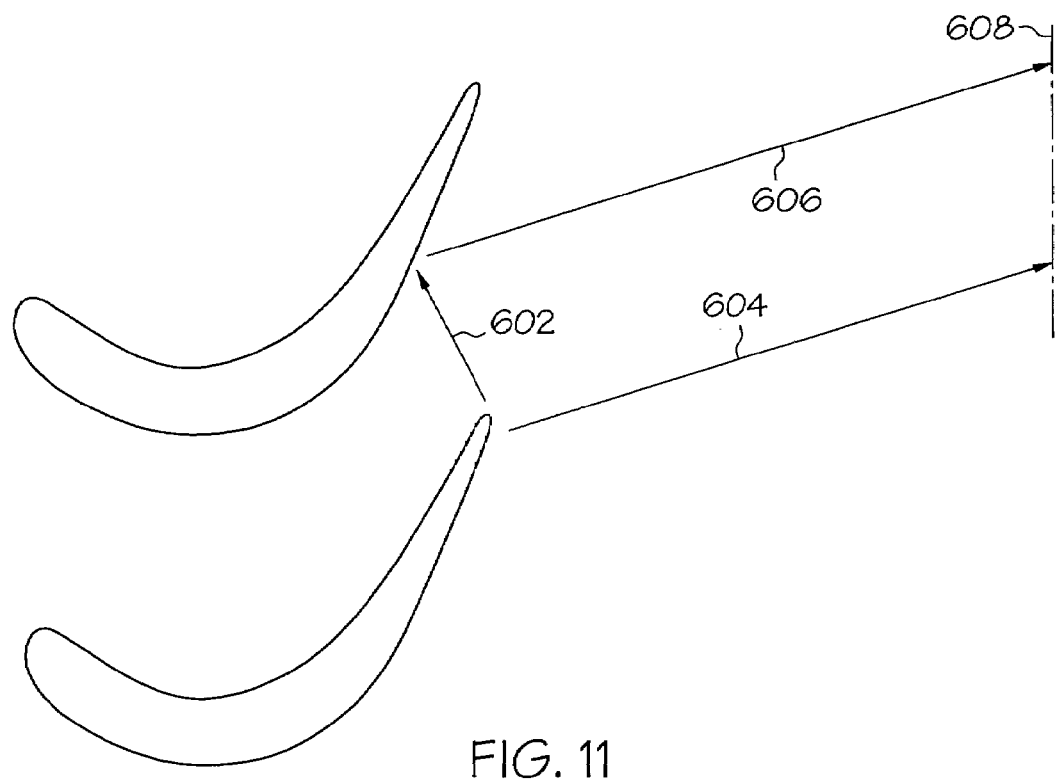
Figure 12:
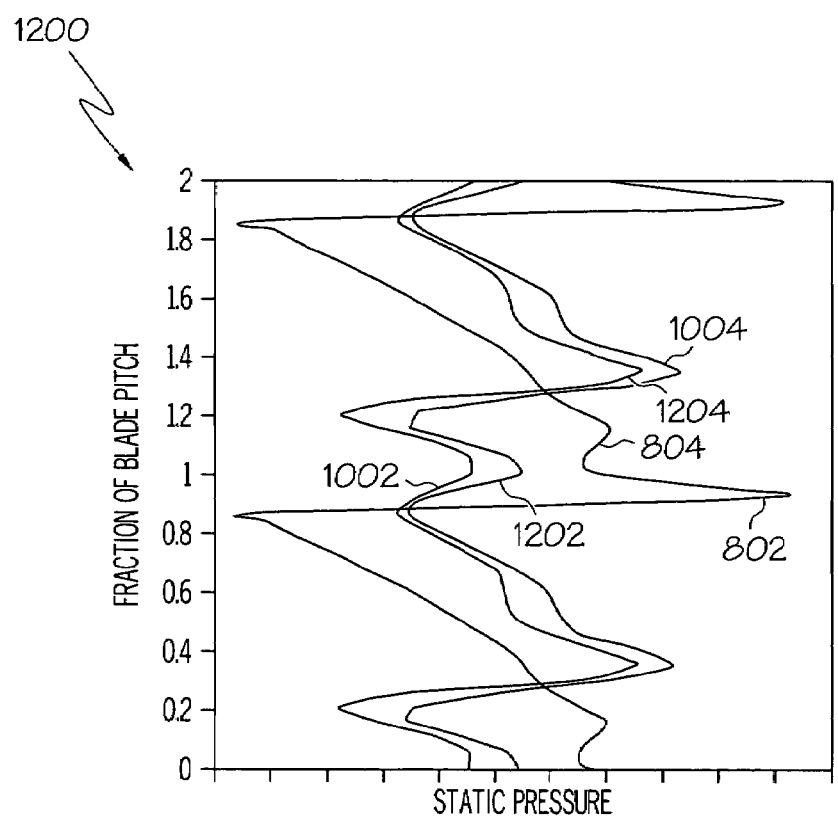
FIG. 12 is a graph that simultaneously illustrates the pitchwise static pressure variation at a downstream location resulting from the airfoils shown in FIGS. 7, 9, and 11.

The analytical results for the above-described iteration are shown in FIGS. 11 and 12. As shown in FIG. 11, the trailing edge suction side shock 602 and the reflected shock 606 are considerably weaker than either of the previous designs. Moreover, as shown in FIG. 12, which conveniently and simultaneously depicts all three iterations on the same graph 1200, the peak-to-peak amplitudes of the pitchwise static pressure variation associated with the trailing edge suction side shock (AMPLITUDE$_{suction}$) 1202 and the reflected shock (AMPLITUDE$_{reflect}$) 1204 are nearly equal, and both ratios (AMPLITUDE$_{suction}$)/(AMPLITUDE$_{reflect}$) and (AMPLITUDE$_{reflect}$)/(AMPLITUDE$_{suctions}$) are less than 2.0. Thus, the desired deviation angle magnitude has thus been determined (508).

Before proceeding further, it was previously mentioned that the above-described process 500 not only reduces the unsteady variation in static pressure at the leading edge 208 of a downstream airfoil 202, but also reduces the change in flow angle at the leading edge 208 of a downstream airfoil 202. Flow angle variation is undesirable because it can cause incidence swings on the downstream airfoil 202 and can thus have a negative impact on the performance of that airfoil 202. Therefore, if the flow angle variation is minimized, the performance of the downstream airfoil 202 is improved.

Figure 13:
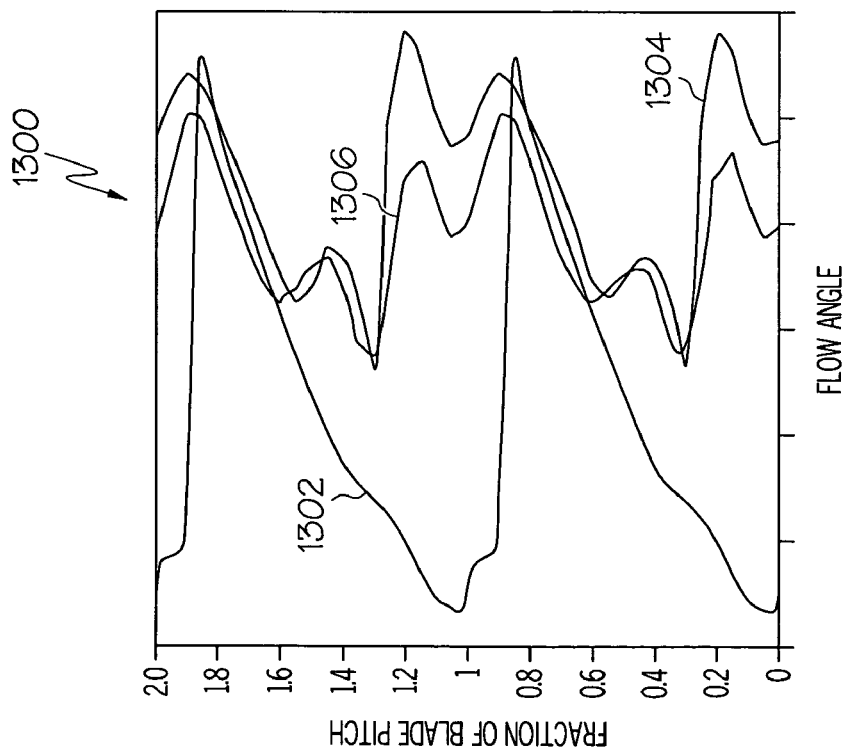
FIG. 13 is a graph that simultaneously illustrates the pitchwise variation in flow angle at a downstream location resulting from the airfoils shown in FIGS. 7, 9, and 11.

To illustrate the additional result of the above-described design process 500, reference should now be made to FIG. 13. In particular, FIG. 13 graphically depicts the pitchwise variation in flow angle and at an axial position that represents the inlet 220 of the downstream airfoil 202. In FIG. 13, the x-axis is the airfoil exit flow angle 410, and the y-axis is (in the relative frame of reference of the transonic airfoil 202) the distance along line 608 as a fraction of blade pitch 226. In viewing FIG. 13, it is seen that the −1.0 degree deviation angle airfoil 202, represented by curve 1302, produces the largest change in flow angle 410, followed by the −6.0 degree deviation angle airfoil 202, which is represented by curve 1304, and then the −5.0 degree deviation angle airfoil 202, which produces the smallest change in flow angle 410 and which is represented by curve 1306.

In addition to varying the airfoil exit deviation angle 412 to minimize the combined shock induced flowfield disturbance, another process can be implemented, in addition to or instead of the previously described process 500, to reduce (or further reduce) the effect from the reflected shock 606 on the downstream flowfield disturbance. In general, this additional process provides an airfoil design in which the airfoil suction surface 206 downstream of the throat 224 is shaped to reduce the strength of the reflected shock 606. In particular, while the process 500 described above assumed a uniform airfoil suction side curvature 416, the additional process results in an airfoil 202 that is designed with an airfoil suction side curvature 416 having a concentrated increase in curvature. More specifically, the process results in an airfoil 202 that is designed with an airfoil suction side curvature 416 having a concentration of convex curvature at the location where a cross passage shock 602 intersects the suction surface 206. This convex curvature concentration acts to minimize the reflection of the cross passage shock 602.

Figure 14:
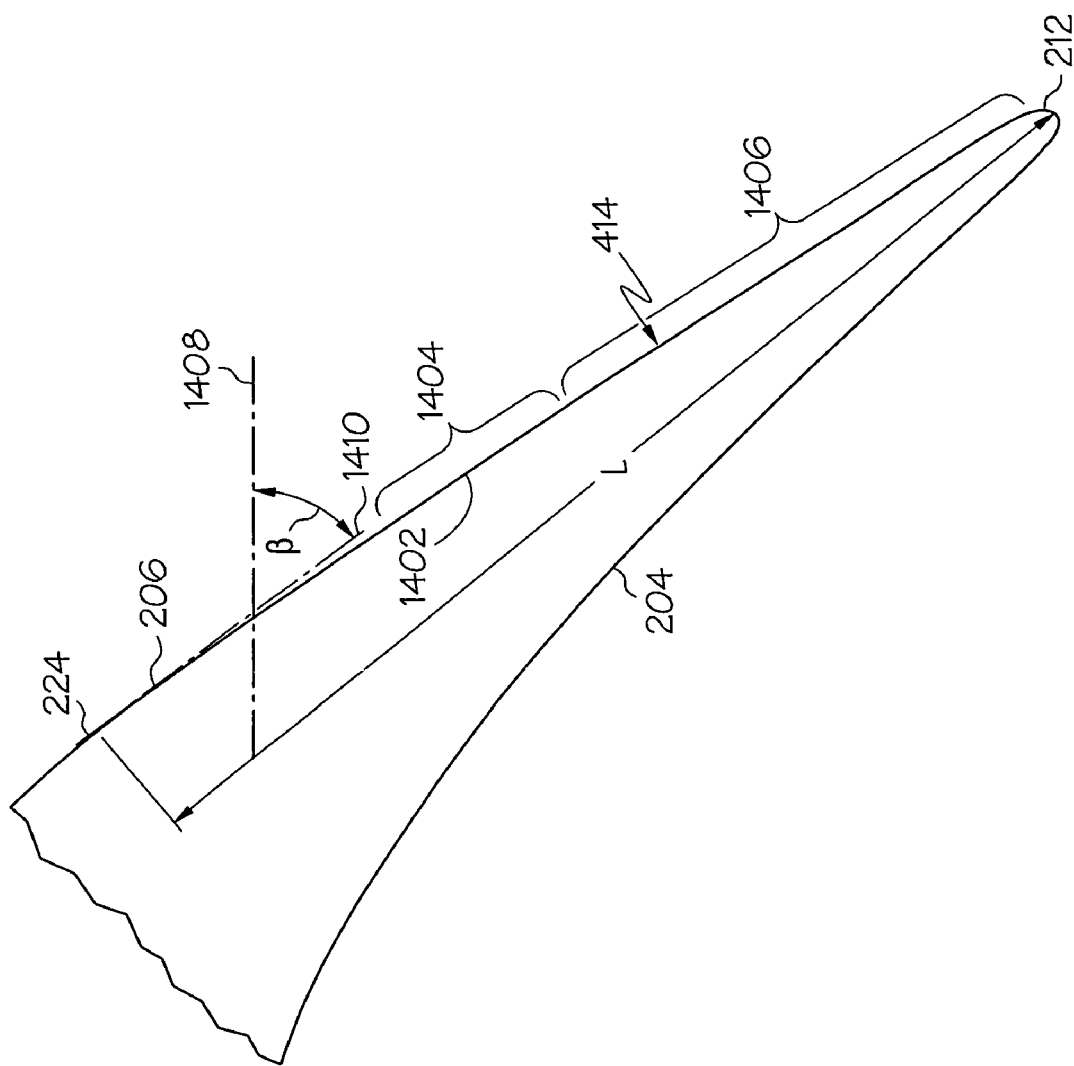
FIG. 14 is a cross section view of a portion of a single transonic airfoil illustrating various additional geometric parameters that are used to describe an airfoil and that are used to further implement the design process of an embodiment of the present invention.

To more fully understand the additional process mentioned above, reference should now be made to FIG. 14, which depicts a single airfoil 202, similar to that shown in FIG. 4. The airfoil 202 shown in FIG. 14 depicts a shock reflection location 1402, a shock reflection region 1404, a downstream region 1406, and an airfoil surface angle (β). The shock reflection location 1402 is the location at which the cross passage shock 602 intersects the suction surface 206. The shock reflection region 1404 is a region that extends a predetermined distance upstream and downstream of the shock reflection location 1402, and the downstream region 1404 is that portion of the suction surface 206 between the shock reflection region 1404 and the trailing edge 212.

The airfoil surface angle (β) illustrated in FIG. 14 is the angle formed between a tangent 1410 of the airfoil suction surface 206 at a given location and a line 1408 that extends parallel to the engine rotational axis 405 (see FIG. 4). It will be appreciated that the predetermined distance that the shock reflection region 1402 extends may vary, but in a preferred embodiment, it is a predetermined percentage of a distance (L) between the throat 224 and the trailing edge 212. It will additionally be appreciated that, although the value of the predetermined percentage may also vary, in a preferred embodiment it is a distance 15% upstream and downstream of the shock reflection location.

To illustrate the additional process, an airfoil designed with the prior process (500) is modified from having a uniform suction side downstream curvature 414, as shown in FIGS. 18 and 19, to have a non-uniform suction side downstream curvature 414. More specifically, the suction side downstream curvature 414 includes a concentrated convex curvature in the shock reflection region 1402, and a very slight concave curvature near the trailing edge 212. The downstream curvature 414 specified reduces the strength of the reflected shock, with minimal impact to the suction side shock.

It has been determined that the appropriate curvature is achieved when 25% or less of the total unguided turning occurs downstream of the reflected shock region 1402. Stated another way, the appropriate curvature is achieved when more than 75% of the total unguided turning occurs between the throat 224 and the end of the shock reflection region 1404. Such an airfoil 202 is described further below. However, before describing this airfoil 202, additional considerations associated with achieving the appropriate suction side curvature will be discussed. During the proceeding discussion, reference will be made to FIGS. 16 and 17.

Figure 15:
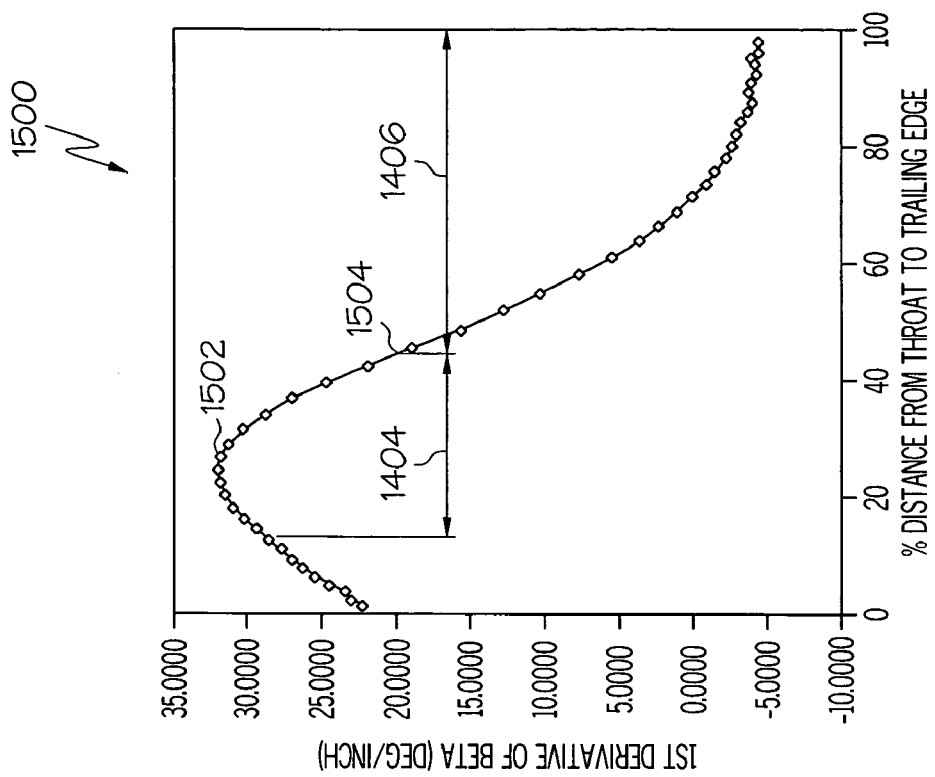
FIG. 15 is a graph illustrating the first derivative of an exemplary airfoil suction side surface angle from the airfoil throat to the airfoil trailing edge.

Turning first to FIG. 15, a plot 1500 of the first derivative of airfoil surface angle (β), which is indicative of surface curvature 414, versus the percent-distance between the throat 224 and the trailing edge 212 is provided. The plot 1500 illustrates a concentration of curvature 1502 in the shock reflection region 1404, which weakens the reflection shock 606. The plot also shows that the suction side curvature 416 in the downstream region 1406 is rapidly reduced and made as slight as possible near the trailing edge 212. The suction side curvature 416 may change sign near the trailing edge 212 (i.e. from a convex surface to a concave surface), but the first derivative of airfoil surface angle (β) near the trailing edge 212 is preferably maintained less than a predetermined magnitude. Although this predetermined magnitude may vary, in a preferred embodiment the predetermined magnitude is 10 degrees/inch.

Figure 16:
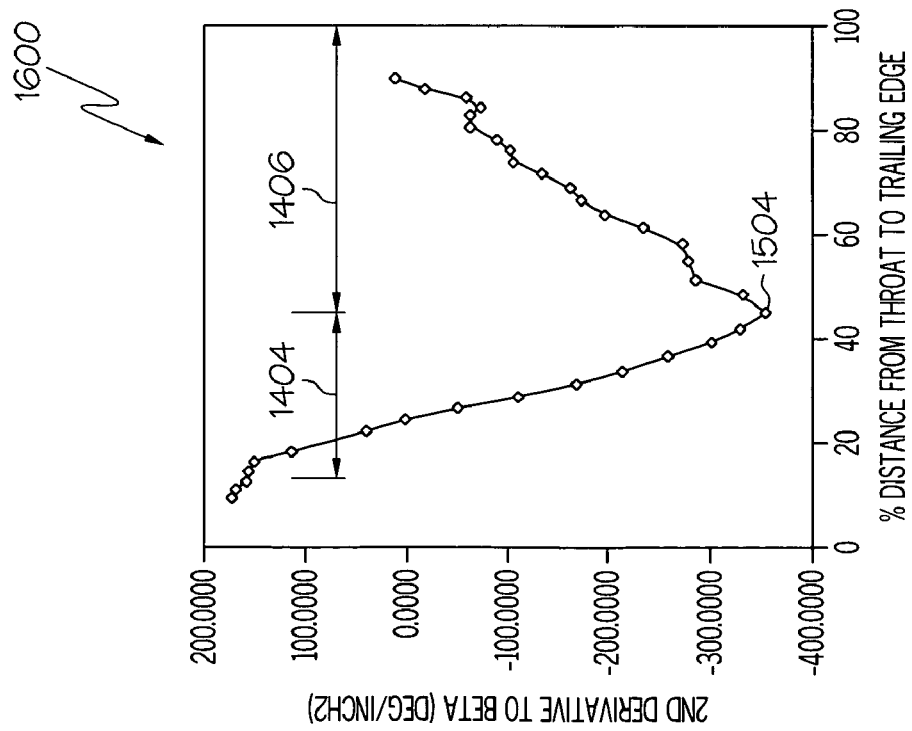
FIG. 16 is a graph illustrating the second derivative of an exemplary airfoil suction side surface angle from the airfoil throat to the airfoil trailing edge.

The rapid reduction in suction side surface curvature 416 described above and illustrated in FIG. 15 can be quantified by locating the inflection point 1504 of the plot 1500 at the end of the shock reflection region 1404. The inflection point 1504, which is the point where the slope of the plot 1500 is maximum, can also be found from a plot 1600 of the second derivative of airfoil surface angle (β), which is illustrated in FIG. 16. Specifically, the inflection point of plot 1500 coincides with the maximum magnitude point of plot 1600.

Figure 17:
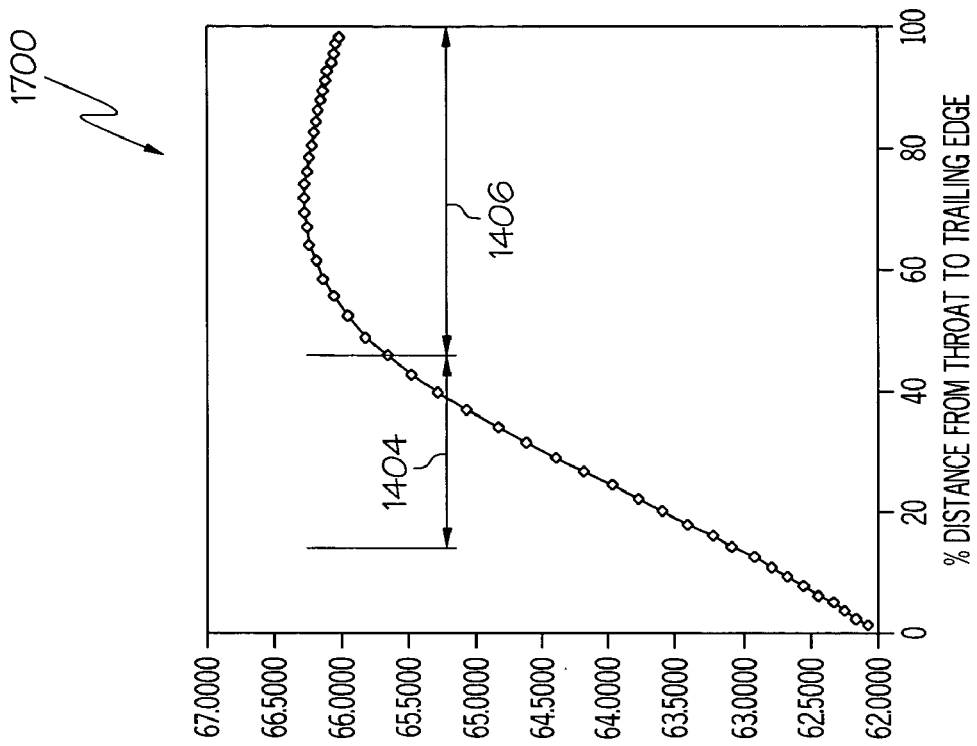
FIG. 17 is a graph illustrating the suction side surface angle from the airfoil throat to the airfoil trailing edge for an airfoil designed according to an embodiment of the present invention.

Turning now to FIG. 17, the resulting surface angle (β) distribution for an optimized airfoil 202 is shown. Specifically, this and the other geometric characteristics are of the optimized airfoil 202 are: the suction side wedge angle 404 and the pressure side wedge angle 406 are each equal to 5.0 degrees; deviation angle 412 is equal to −5.0 degrees; downstream turning 414 is equal to 4.0 degrees; the exit relative mach number is 1.06; and the downstream curvature 416 is non-uniform. In addition, the airfoil surface angle (β) for the airfoil 202 changes from 62.0 degrees at the throat 224 to 66.0 degrees at the trailing edge 210. As FIG. 17 shows, the airfoil surface angle (β) for this airfoil 202 changes such that 3.5 degrees of this turning occurs within the first 45% of the distance (L) (i.e. before the end of the shock reflection region 1404). The remaining 0.5 degrees of turning, which is relatively small, occurs in the last 55% of the distance (L). Thus, the amount of airfoil turning is <25% of the total turning within the distance (L).

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

I claim:

1. A method of designing adjacent transonic airfoils to minimize downstream shock induced flowfield disturbance in an engine having a rotational axis, each transonic airfoil having an adjacent airfoil, and further having a pressure surface, a suction surface, a predetermined airfoil exit mach number, an exit flow angle, a pressure side trailing edge wedge angle, a suction side trailing edge wedge angle, and a suction side throat angle, the method comprising the steps of:
   selecting an airfoil exit deviation angle, the airfoil exit deviation angle having a magnitude;
   determining a combined shock induced flowfield disturbance at a position that corresponds to a leading edge of a downstream airfoil, the combined shock induced flowfield disturbance resulting, at least in part, from a suction side shock and a reflected shock, the suction side shock being a shock that emanates from the airfoil trailing edge suction side, the reflected shock resulting from a cross passage shock that emanates from the airfoil trailing edge pressure side and reflects off an adjacent airfoil suction side; and
   varying the airfoil exit deviation angle until the combined shock induced flowfield disturbance at the position that corresponds to a leading edge of a downstream airfoil is minimized,
   wherein:
     a line that bisects the pressure surface and the suction surface defines a trailing edge metal line,
     an angle between flow streamlines downstream of the airfoil trailing edge and a line that extends parallel to the engine rotational axis defines an airfoil exit flow angle,
     an angle between the trailing edge metal line and the line that extends parallel to the engine rotational axis defines a trailing edge metal angle,
     an angle between the trailing edge metal angle and the airfoil exit flow angle defines the airfoil exit deviation angle, and
     the step of determining the combined shock induced flow field disturbance comprises:
       determining a peak-to-peak amplitude of a suction shock static pressure variation at the position that corresponds to a leading edge of a downstream airfoil, the suction shock static pressure variation resulting from the suction side shock;
       determining a peak-to-peak amplitude of a reflected shock static pressure variation at the position that corresponds to a leading edge of a downstream airfoil, the reflected shock static pressure variation resulting from the reflected shock; and
       comparing the peak-to-peak amplitude of the suction shock static pressure variation and the reflected shock static variation to determine which is greater.

2. The method of claim 1, wherein the step of varying the airfoil exit deviation angle comprises:
   varying the airfoil exit deviation angle until a ratio of the compared peak-to-peak amplitudes is less than a predetermined value.

3. The method of claim 2, wherein:
   if the peak-to-peak amplitude of the suction side shock static pressure variation is greater than the peak-to-peak amplitude of the reflected shock static pressure variation, then the ratio is the peak-to-peak amplitude of the suction side shock static pressure variation divided by the peak-to-peak amplitude of the reflected shock static pressure variation; and if the peak-to-peak amplitude of the reflected shock static pressure variation is greater than the peak-to-peak amplitude of the suction side shock static pressure variation, then the ratio is the peak-to-peak amplitude of the reflected shock static pressure variation divided by the peak-to-peak amplitude of the suction side shock static pressure variation.

4. The method of claim 3, wherein the predetermined value is 2.0.

5. The method of claim 1, further comprising:
implementing the airfoil suction surface with uniform convex curvature.

6. The method of claim 1, further comprising:
determining a cross passage shock location on each airfoil suction surface, the cross passage shock location disposed within a shock reflection region and corresponding to a location off of which a shock that emanates from an adjacent airfoil trailing edge pressure surface reflects; and providing each airfoil suction surface with convex curvature at the cross passage shock location.

7. The method of claim 6, wherein the concentrated convex curvature has a maximum downstream of the airfoil throat and within the cross passage shock reflection region.

8. The method of claim 6, wherein the cross passage shock reflection region extends a predetermined distance upstream and downstream of the shock reflection location.

9. The method of claim 8, wherein the predetermined distance is a predetermined percentage of a distance between the airfoil throat and the airfoil trailing edge.

10. The method of claim 9, wherein the predetermined percentage is 15%.

11. The method of claim 6, wherein:
each airfoil suction side surface has a curvature defined, at least in part, by a turning between the airfoil throat and the airfoil trailing edge; and at least 75% of the turning occurs between the airfoil throat and an end of the shock reflection region.

12. A method of designing adjacent transonic airfoils to minimize downstream shock induced flowfield disturbance, each transonic airfoil including at least two adjacent airfoils, a suction surface and a pressure surface coupled together via a leading edge and a trailing edge, each airfoil spaced apart from its adjacent airfoils to define an airfoil passage therebetween and an airfoil throat, the method comprising the steps of:

determining a cross passage shock location on each airfoil suction surface, the cross passage shock location disposed within a shock reflection region and corresponding to a location off of which a shock that emanates from an adjacent airfoil trailing edge pressure surface reflects; and providing each airfoil suction surface with a concentrated convex curvature at the cross passage shock location, wherein:
the cross passage shock reflection region extends a predetermined distance upstream and downstream of the shock reflection location, and
the predetermined distance is 15% of a distance between the airfoil throat and the airfoil trailing edge.

13. The method of claim 12, wherein the concentrated convex curvature has a maximum downstream of the airfoil throat and within the cross passage shock reflection region.

14. The method of claim 12, wherein:
each airfoil suction side surface has a curvature defined, at least in part, by a turning between the airfoil throat and the airfoil trailing edge; and at least 75% of the turning occurs between the airfoil throat and an end of the shock reflection region.

15. A method of designing adjacent transonic airfoils to minimize downstream shock induced flowfield disturbance, each transonic airfoil having an adjacent airfoil and a predetermined airfoil exit mach number, exit flow angle, pressure side trailing edge wedge angle, suction side trailing edge wedge angle, and suction side throat angle, the method comprising the steps of:

selecting an airfoil exit deviation angle for one of the transonic airfoils, the airfoil exit deviation angle having a magnitude;

determining a combined shock induced flowfield disturbance at a position that corresponds to a leading edge of a downstream airfoil, the combined shock induced flowfield disturbance resulting, at least in part, from a suction side shock and a reflected shock, the suction side shock being a shock that emanates from the airfoil trailing edge suction side, the reflected shock resulting from a cross passage shock that emanates from the airfoil trailing edge pressure side and reflects off an adjacent airfoil suction side; and varying the airfoil exit deviation angle until the combined shock induced flowfield disturbance at the position that corresponds to a leading edge of a downstream airfoil is minimized, wherein the step of determining the combined shock induced flow field disturbance comprises:
determining a peak-to-peak amplitude of a suction shock static pressure variation at the position that corresponds to a leading edge of a downstream airfoil, the suction shock static pressure variation resulting from the suction side shock;

determining a peak-to-peak amplitude of a reflected shock static pressure variation at the position that corresponds to a leading edge of a downstream airfoil, the reflected shock static pressure variation resulting from the reflected shock;

comparing the peak-to-peak amplitude of the suction shock static pressure variation and the reflected shock static variation to determine which is greater.

16. A method of designing adjacent transonic airfoils to minimize downstream shock induced flowfield disturbance, each transonic airfoil including at least two adjacent airfoils, a suction surface and a pressure surface coupled together via a leading edge and a trailing edge, each airfoil spaced apart from its adjacent airfoils to define an airfoil passage therebetween and an airfoil throat, the method comprising the steps of:

determining a cross passage shock location on each airfoil suction surface, the cross passage shock location disposed within a shock reflection region and corresponding to a location off of which a shock that emanates from an adjacent airfoil trailing edge pressure surface reflects; and providing each airfoil suction surface with a concentrated convex curvature at the cross passage shock location, wherein:
each airfoil suction side surface has a curvature defined, at least in part, by a turning between the airfoil throat and the airfoil trailing edge, and at least 75% of the turning occurs between the airfoil throat and an end of the shock reflection region.

* * * * *